United States Patent
Holloway et al.

(10) Patent No.: US 6,803,668 B2
(45) Date of Patent: Oct. 12, 2004

(54) PROCESS-ROBUST ALIGNMENT MARK STRUCTURE FOR SEMICONDUCTOR WAFERS

(75) Inventors: Karen L. Holloway, Poughkeepsie, NY (US); Andrew Lu, Beacon, NY (US); Qiang Wu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/303,501

(22) Filed: Nov. 22, 2002

(65) Prior Publication Data

US 2004/0099963 A1 May 27, 2004

(51) Int. Cl.⁷ .............................................. H01L 23/544
(52) U.S. Cl. ............................. 257/797; 438/401
(58) Field of Search ........................... 257/797, 401, 257/462; 438/401, 462

(56) References Cited

U.S. PATENT DOCUMENTS

| | | | |
|---|---|---|---|
| 4,704,027 A | 11/1987 | Phillips | 355/43 |
| 5,329,334 A | 7/1994 | Yim et al. | 355/53 |
| 5,503,962 A | 4/1996 | Caldwell | 430/317 |
| 5,786,260 A | 7/1998 | Jang et al. | 438/401 |
| 5,911,108 A | 6/1999 | Yen | 438/401 |
| 5,923,996 A | 7/1999 | Shih et al. | 438/462 |
| 5,981,352 A | 11/1999 | Zhao et al. | 438/401 |
| 6,037,671 A | 3/2000 | Kepler et al. | 257/797 |
| 6,049,137 A | 4/2000 | Jang et al. | 257/797 |
| 6,083,807 A * | 7/2000 | Hsu | |
| 6,235,437 B1 | 5/2001 | Neoh et al. | 430/22 |
| 6,249,036 B1 | 6/2001 | Kajita et al. | 257/509 |
| 6,274,940 B1 * | 8/2001 | Baker et al. | |
| 6,342,735 B1 * | 1/2002 | Colell et al. | |
| 6,388,341 B2 * | 5/2002 | Arai et al. | |
| 6,479,904 B1 * | 11/2002 | Maejima | |

* cited by examiner

*Primary Examiner*—S. V. Clark
(74) *Attorney, Agent, or Firm*—Ira D. Blecker; Cantor Colburn LLP

(57) ABSTRACT

An alignment mark structure for use upon a semiconductor substrate is disclosed. In an exemplary embodiment, the alignment mark structure includes a plurality of segments arranged in an alignment pattern, with each of the plurality of segments being formed from a base pattern created on the substrate. The base pattern includes a plurality of sizes, wherein each of the plurality of sizes of the base pattern is repeated throughout an entire length of each of the plurality of segments.

20 Claims, 6 Drawing Sheets

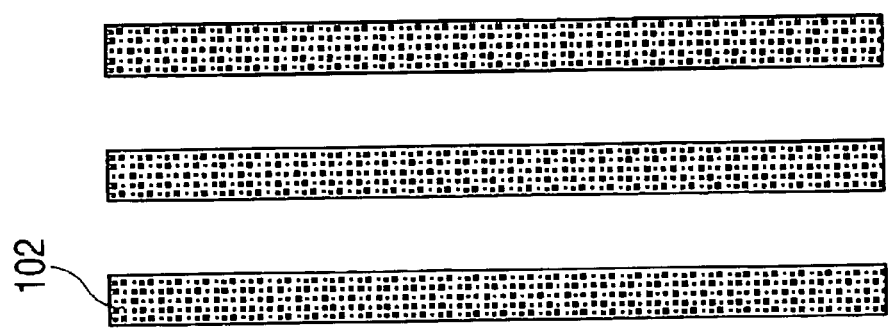
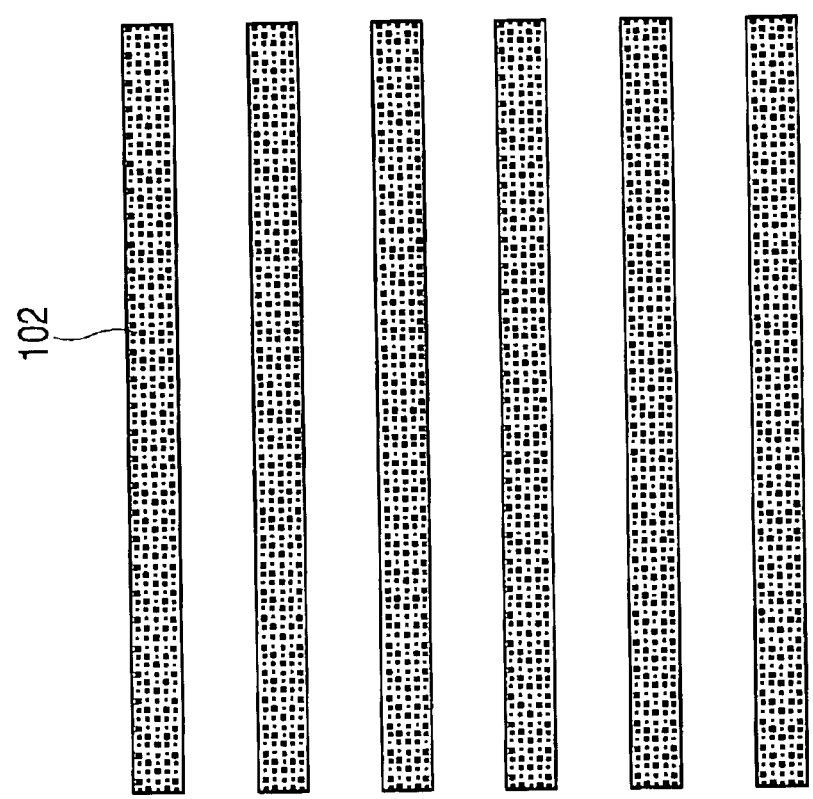
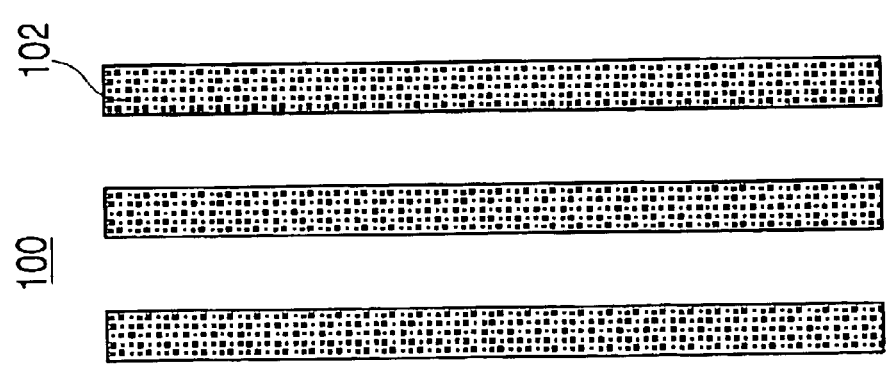
FIG. 3

PROCESS-ROBUST ALIGNMENT MARK STRUCTURE FOR SEMICONDUCTOR WAFERS

BACKGROUND

The present disclosure relates generally to semiconductor device manufacturing and, more particularly, to a process-robust alignment mark structure for semiconductor wafers.

The fabrication of integrated circuit (IC) devices on a semiconductor wafer involves a number of steps wherein patterns are transferred from photolithographic masks to the wafer. A masking step, for example, includes an etching step and defines selected areas to be exposed on the wafer for subsequent processes such as oxidation, metal deposition and impurity introduction. With IC device and feature sizes becoming increasingly smaller, it is important for a photolithographic mask to be aligned precisely with the wafer during the masking step in order to minimize any misalignment between the layers.

Most alignment schemes utilize alignment targets or marks that are defined on the wafer during a previous processing step. Typically, each alignment target includes topographical marks which may be formed by etching a plurality of "steps" into the wafer. These steps may have, for example, a height of about 1,200 angstroms (Å), with a width and spacing therebetween of about 10 microns ($\mu$m). The alignment targets are used to diffract a laser alignment beam generated by a photolithography machine (commonly known as a wafer stepper) during the masking process. The diffraction pattern is received by the wafer stepper, and the relative position of the wafer and the photolithographic mask is thereafter adjusted accordingly so that the pattern of the photolithographic mask is transferred to the wafer in the precise location as desired.

Alignment marks created on wafer layers are often specifically designed with the particular processing step in mind in order to result in a sufficient contrast with the processed layer. For example, during the fabrication of the integrated circuit structures, a number of metallization layers are formed. Each of the metallization layers is typically separated from another metallization layer by an insulating layer therebetween. To provide an overlying metallization layer without discontinuities or other flaws, it is desirous to have an underlying surface for the metallization layer that is as flat or planar as possible. It has thus become commonplace to smooth the surface of a layer in preparation for a subsequently formed metallization layer by applying a planarization process. Certain planarization techniques, such as chemical-mechanical polishing (CMP), often result in a dishing or indentation of the wafer surface. Accordingly, alignment marks to be formed in metallization layers may include small segmented patterns of a uniform dimension so that dishing does not affect the integrity of the mark. A particular segment dimension may even be determined experimentally or by trial and error prior to incorporating the mark design into the wafer.

Unfortunately, process variations can also impact the contrast of an alignment mark. For example, a variation in the degree of CMP dishing, or perhaps a variation in the amount of applied chemical vapor deposition (CVD) metal fill, might make a mark more or less visible with regard to the particular imaging method of the wafer stepper. The variations may be from wafer to wafer and lot to lot. Furthermore, a change in process can result in the necessity for new alignment mark design and/or new reticle manufacture, along with the increased costs associated therewith. It is desirable, therefore, to provide an alignment mark structure with reduced susceptibility to process variability which might otherwise result in rework or other adverse effects upon the IC chip function.

BRIEF SUMMARY

The above discussed and other drawbacks and deficiencies of the prior art are overcome or alleviated by an alignment mark structure for use upon a semiconductor substrate. In an exemplary embodiment, the alignment mark structure includes a plurality of segments arranged in an alignment pattern, with each of the plurality of segments being formed from a base pattern created on the substrate. The base pattern includes a plurality of sizes, wherein each of the plurality of sizes of the base pattern is repeated throughout an entire length of each of the plurality of segments.

In one aspect, the base pattern is a square pattern wherein individual squares within the base pattern are arranged into rows and columns, with each square being situated proximate another square having a different size, along a horizontal and vertical direction. The individual squares may be formed as raised surfaces on the semiconductor substrate or, alternatively, as depressions within the semiconductor substrate. In an alternative embodiment, the base pattern is an elongated diagonal.

BRIEF DESCRIPTION OF THE DRAWINGS

Referring to the exemplary drawings wherein like elements are numbered alike in the several Figures:

FIG. 3 schematically illustrates a top view of an exemplary embodiment of a novel alignment mark structure having horizontally and vertically oriented alignment marks;

DETAILED DESCRIPTION

Figure 1:
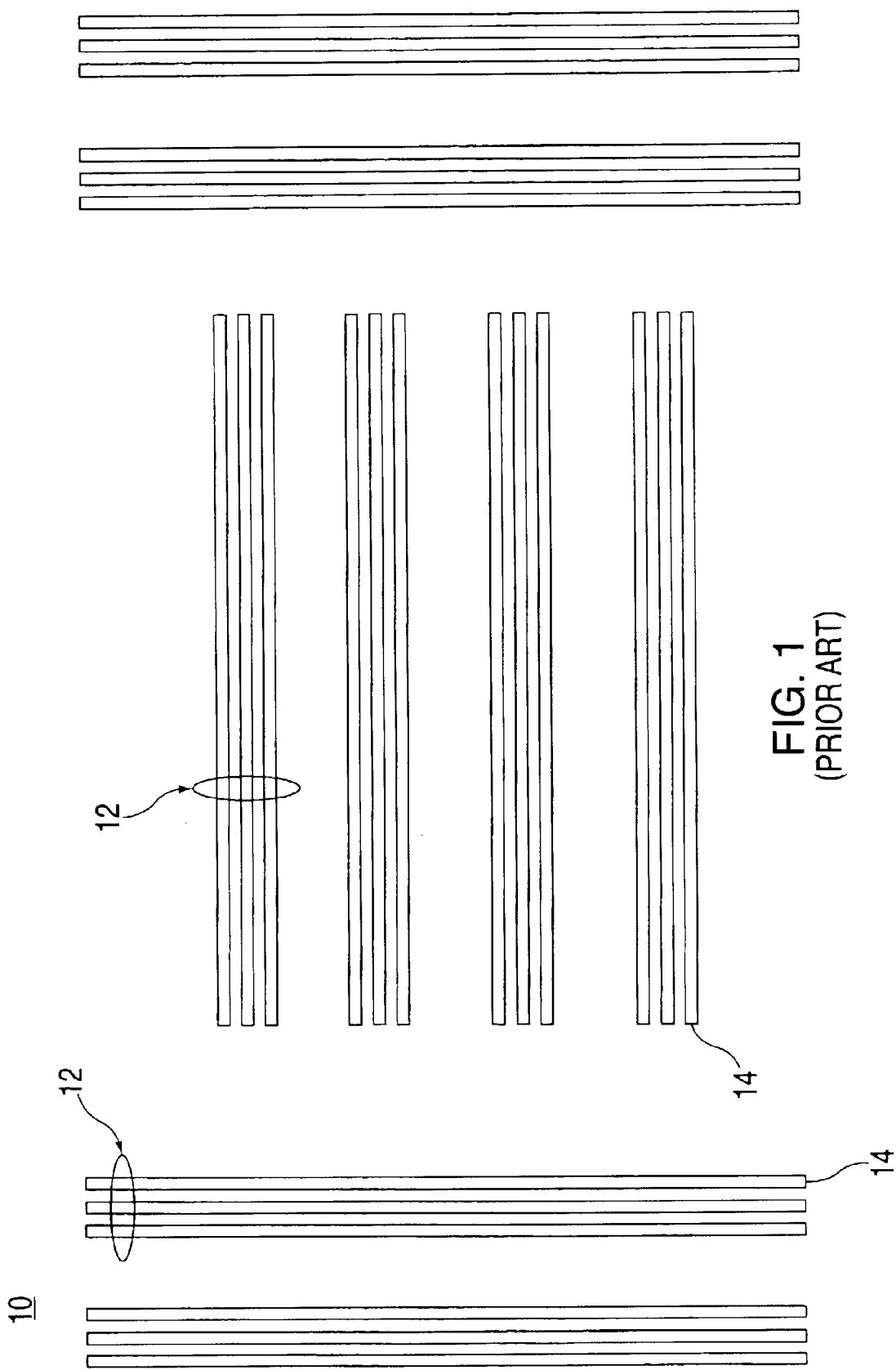
FIG. 1 schematically illustrates a top view of an existing 3-segmented alignment mark structure having both horizontally and vertically oriented alignment marks.

Referring initially to FIG. 1, there is shown a top view of an existing 3-segmented alignment mark structure 10. In the example shown, the alignment mark structure 10 is a Nikon "2DFIA" 3-segmented mark including a series of alignment marks 12 arranged in horizontal and vertical patterns. Each alignment mark 12 is further broken down into three individual segments 14, as can be see in greater detail in FIG. 2. The segments 14 are generally of a uniform length and width and may be formed upon a particular layer of a semiconductor wafer during the manufacturing process thereof. The segments 14 may also take the form of raised surfaces upon a layer or, alternatively, trenches formed within the layer.

Figure 2:
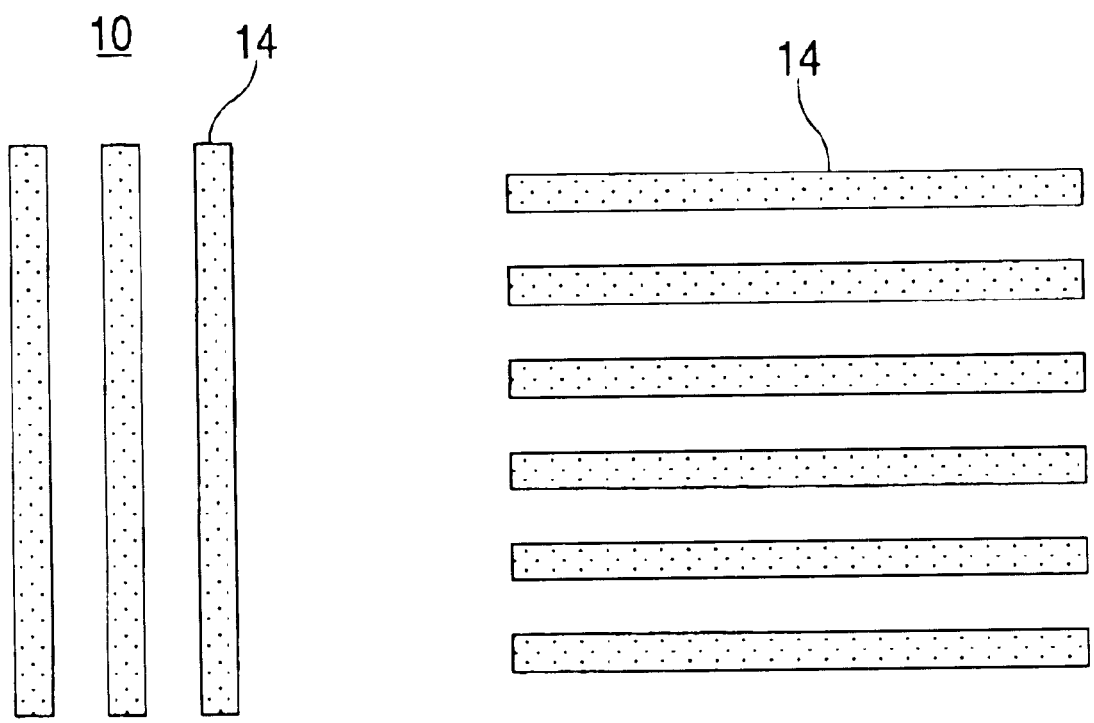
FIG. 2 is a top view detailing one of the uniformly dimensioned, 3-segmented alignment marks shown in FIG. 1.

The segments 14 are shown in closer detail in FIG. 2. As can be seen, the segment configuration in conventional alignment mark arrangements is that of a fairly uniform layout. Ideally, the segmentation is designed such that process characteristics such as polish and metal fill create a clear mark of high contrast. However, as stated previously, variations or changes in the process can render the mark less useful if the segmentation dimension used in the mark is specifically impacted in some way by the process change.

Therefore, in accordance with an embodiment of the invention, there is disclosed a novel alignment mark structure and method that is robust to process changes or variations. That is, the alignment marks will still show up in clear contrast if there is a process change or variation in the dimension of the segmentation. As such, if part of a process results in a failure to delineate one dimension of segmentation within the mark, another dimension of segmentation should still appear in good contrast instead. Generally stated, the desired periodicities read by a stepper will still be retained, however the individual features making up the segmentation are varied in size and/or shape such that at least some part of the mark will appear in good contrast after processing.

Referring now to FIG. 3, there is shown a top view of a 3-segmented alignment mark structure 100, in accordance with an embodiment of the invention. For purposes of comparison only, the individual marks 102 are shown in the same general configuration of those in FIG. 1 (i.e., the Nikon 2DFIA configuration of rows of horizontally and vertically disposed marks). It will be come readily apparent, however, upon closer inspection of the make up of the individual marks, that the patterning thereof provides a robust pattern of contrast notwithstanding any process changes or variations.

In the embodiment depicted in FIG. 3, each individual mark 102 is formed from a pattern of squares having various ranges of sub-micron sizes. Although the squares may be formed as either raised surfaces or depressions within the wafer, they are illustrated herein as being depressions or holes formed in the wafer surface. The pattern of squares is shown in greater detail in FIG. 4. As is shown, there are three individual square sizes, represented by squares 104 having a first size, squares 106 having a second size greater than the first size, and by squares 108 having a third size greater than the second size. In an exemplary embodiment, the squares are further arranged into an array of rows and columns wherein any given square in the array is directly adjacent another square of a different size in a horizontal or vertical direction. In other words, a square of (for example) the first size is only proximate another square of the first size in a diagonal direction. Depending upon the particular manufacturing process, an exemplary size range for the squares may be 0.5, 0.6 and 0.8 microns ($\mu$m) for the side lengths of three square sizes, respectively. However, for certain other processes, the range may be increased or decreased (e.g., 0.15, 0.20 and 0.25 $\mu$m).

It will be appreciated that the patterning of the squares need not be limited to just three discrete sizes, nor need the squares be arranged in a row/column fashion. Rather, the significance of the illustrated embodiment lies in the variation of the dimension of the alignment mark segmentation. Thus configured, the marks may be made to be visible with good contrast under a wider range of process conditions that may be present during wafer manufacturing. By having, for example, three differently mark patterns, it is anticipated that at least one-third of the marks will be detected regardless of any encountered process variations. In turn, the increased contrast and better alignment for wafers and lots within a process results in a decreased cost of rework processes and the possible redesign of new, customized alignment marks and the manufacture of new reticles to create such new marks.

Figure 4:
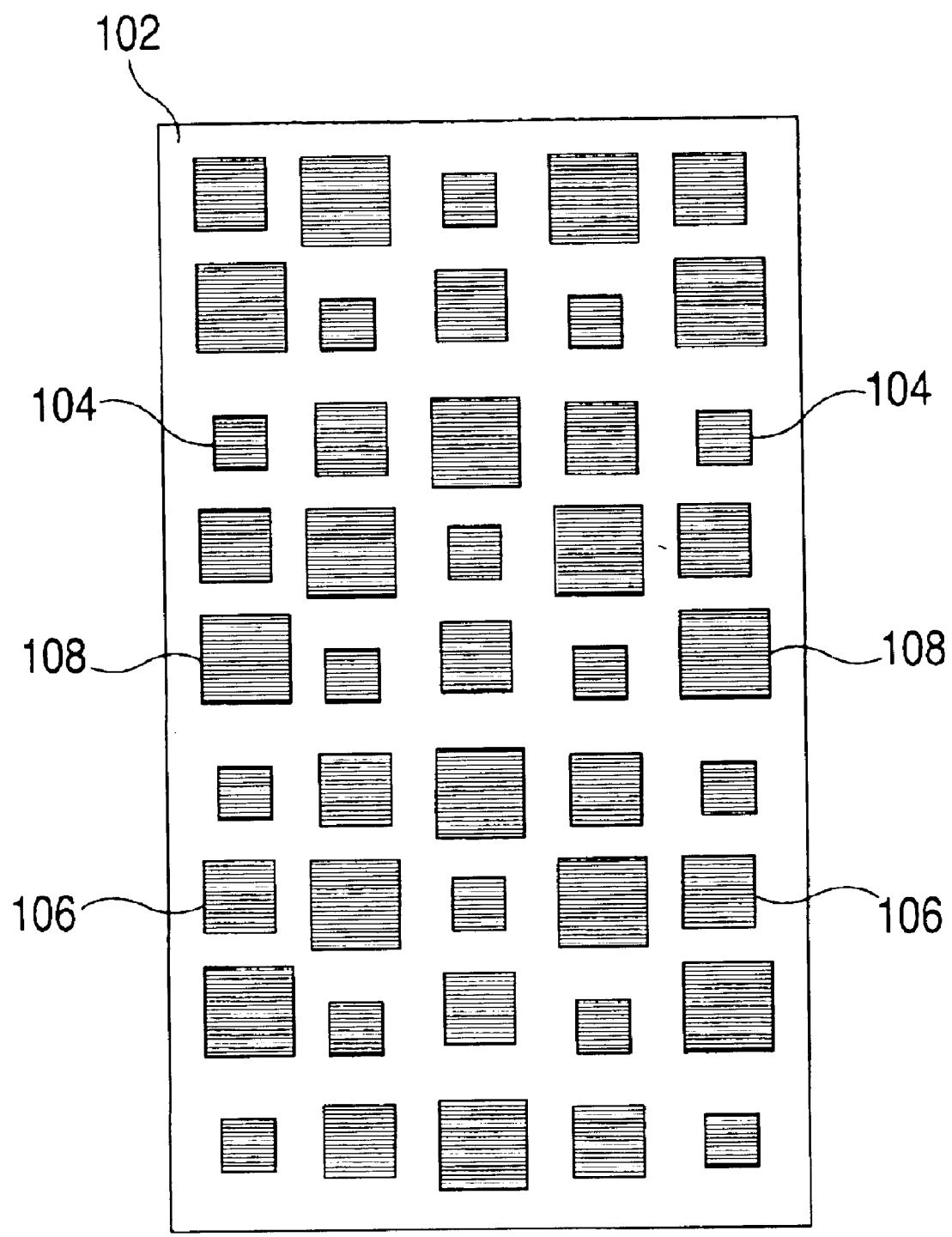
FIG. 4 is a top view detailing one of the alignment marks shown in FIG. 3, particularly illustrating a variable segmented pattern that forms the mark.
Figure 5:
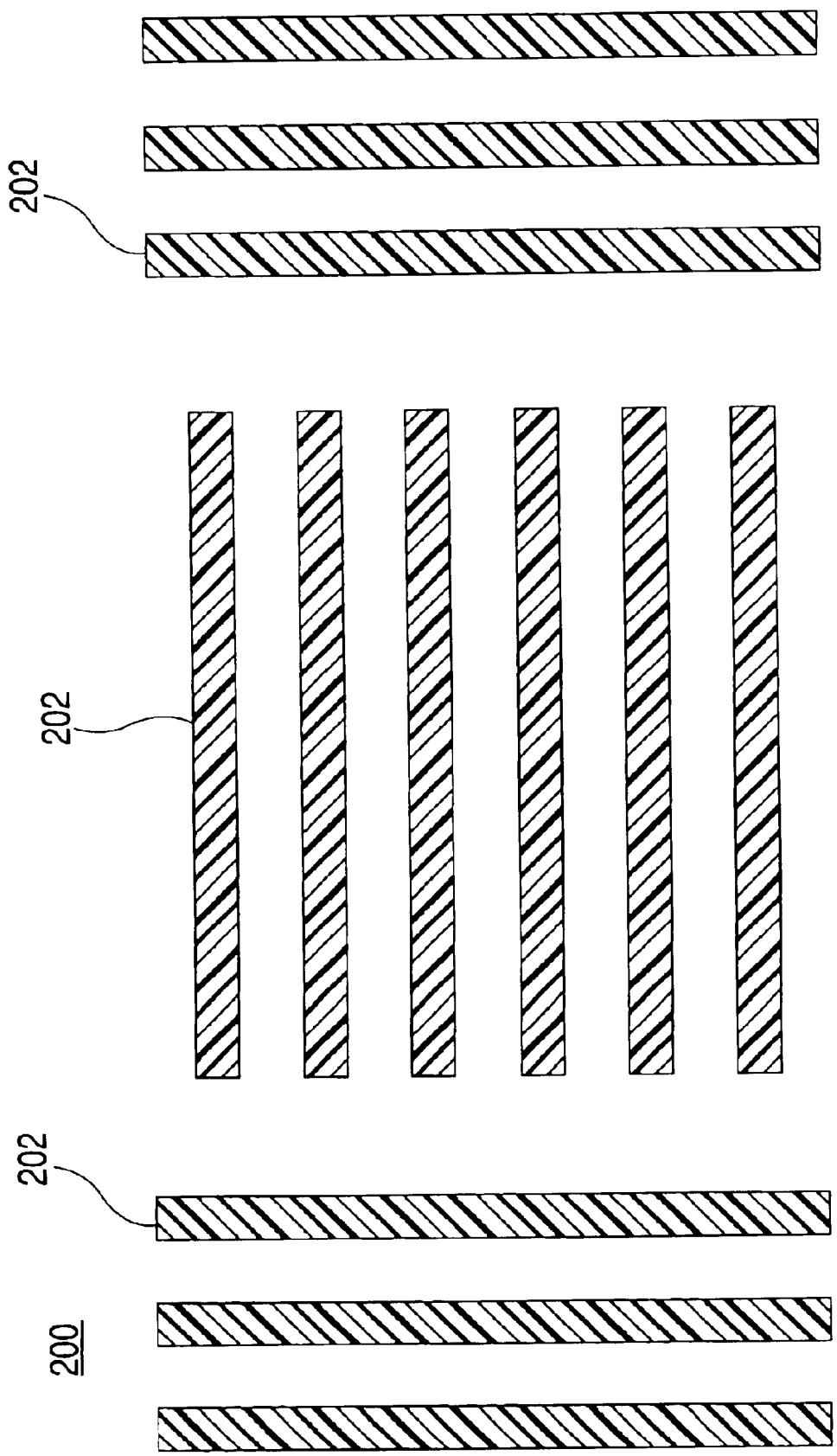
FIG. 5 schematically illustrates a top view of an alternative embodiment of the alignment mark structure of FIG. 3.
Figure 6:
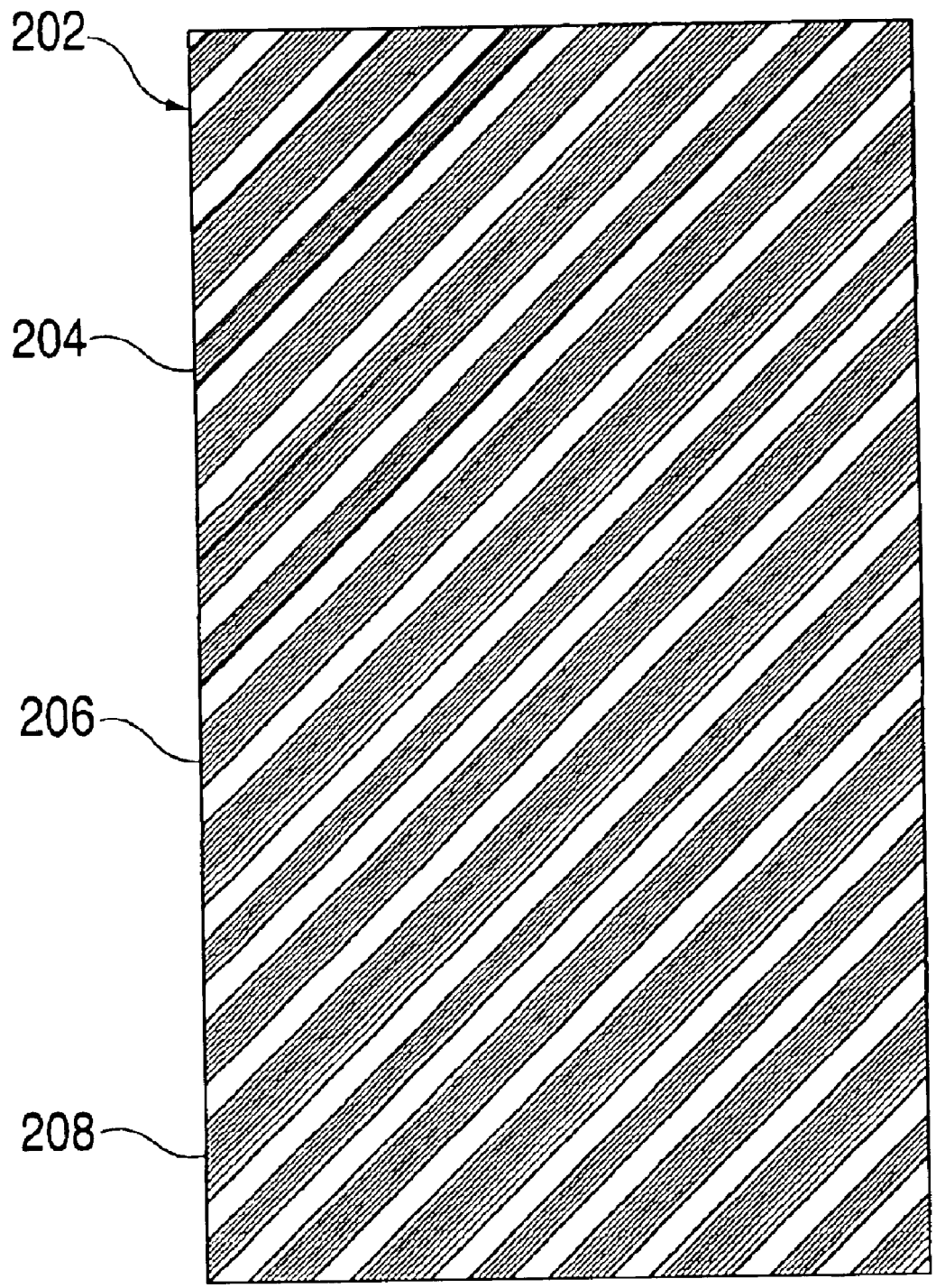
FIG. 6 is a top view detailing one of the alignment marks shown in FIG. 5, particularly illustrating an alternative segmented pattern that forms the mark.

Not only are the size and arrangement of the square marks not limited to the example of FIG. 4, other base shapes may also be used. For example, FIGS. 5 and 6 illustrate one possible alternative embodiment for an alignment mark structure 200. Again, for purposes of comparison, a Nikon 2DFIA mark structure is shown in FIG. 5. As is shown most particularly in FIG. 6, the basic unit which makes up an individual mark 202 is an elongated diagonal that may take the form of a diagonally disposed trench or, alternatively, a diagonally disposed ridge. Like the embodiment of FIGS. 3 and 4, the elongated diagonals are formed with three distinct widths 204, 206, 208 to provide good contrast. In addition, each diagonal is bordered by at least one other diagonal having a different width.

Moreover, although the exemplary base patterns shown and described herein thus far have all been regular patterns and of the same feature shape, it will further be appreciated that it is also within the scope of the present invention to have different feature shapes mixed in the same base pattern (as well as to have irregular patterns), so long as the pattern continues throughout the entire length of the segment. For example, the base pattern could include both rectangles and diagonals.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An alignment mark structure for use upon a semiconductor substrate, the structure comprising:
   a plurality of individual segments arranged in an alignment pattern; and
   each of said plurality of individual segments further comprising a pattern of selected shapes created on the substrate;
   said pattern of selected shapes including a plurality of sizes therein;
   wherein each of said plurality of sizes of said pattern of selected shapes is continued throughout an entire length of each of said plurality of individual segments.

2. The alignment mark structure of claim 1, wherein said pattern of selected shapes is a square pattern.

3. The alignment mark structure of claim 2, wherein said plurality of sizes includes a first size, a second size and a third size, and wherein said second size is greater than said first size and said third size is greater than said second size.

4. The alignment mark structure of claim 3, wherein individual squares within said pattern of selected shapes are arranged into rows and columns.

5. The alignment mark structure of claim 4, wherein each square is situated proximate another square having a different size, along a horizontal and vertical direction.

6. The alignment mark structure of claim 3, wherein:
   said first size is a square having sides of about 0.5 $\mu$m length;

said second size is a square having sides of about 0.6 μm in length; and said third size is a square having sides of about 0.8 μm in length.

7. The alignment mark structure of claim 3, wherein:

said first size is a square having sides of about 0.15 μm in length;

said second size is a square having sides of about 0.20 μm in length; and said third size is a square having sides of about 0.25 μm in length.

8. The alignment mark structure of claim 2, wherein said squares are formed as raised surfaces on the semiconductor substrate.

9. The alignment mark structure of claim 2, wherein said squares are formed as depressions within the semiconductor substrate.

10. The alignment mark structure of claim 1, wherein said pattern of selected shapes is an elongated diagonal.

11. A method for attaining alignment integrity on a semiconductor substrate, the method comprising:

forming an alignment mark having a plurality of individual segments, arranged in an alignment pattern on the substrate;

each of said plurality of segments being formed from a pattern of selected shapes created on the substrate;

said pattern of selected shapes including a plurality of sizes therein;

wherein each of said plurality of sizes of said pattern of selected shapes is continued throughout a entire length of each of said plurality of individual segments.

12. The method of claim 11, wherein said pattern of selected shapes is a square pattern.

13. The method of claim 12, wherein said plurality of sizes includes a first size, a second size and a third size, and wherein said second size is greater than said first size and said third size is greater than amid second size.

14. The method of claim 13, wherein individual squares within said pattern of selected shapes are arranged into rows and columns.

15. The method of claim 14, wherein each square is situated proximate another square having a different size along a horizontal and vertical direction.

16. The method of claim 13, wherein:

said first size is a square having sides of about 0.5 μm in length;

said second size is a square having sides of about 0.6 μm in length; and said third size is a square having sides of about 0.8 μm in length.

17. The method of claim 13, wherein:

said first size is a square having sides of about 0.15 μm in length;

said second size is a square having sides of about 0.20 μm in length; and said third size is a square having sides of about 0.25 μm in length.

18. The method of claim 12, wherein said squares are formed as raised surfaces on the semiconductor substrate.

19. The method of claim 12, wherein said squares are formed as depressions within the semiconductor substrate.

20. The method of claim 11, wherein said pattern of selected shapes is an elongated diagonal.

* * * * *